United States Patent [19]

Le Floch

[11] Patent Number: 4,486,716
[45] Date of Patent: Dec. 4, 1984

[54] DIGITAL FM DEMODULATOR USING DELAY CIRCUITS

[75] Inventor: Gérard Le Floch, Montgeron, France

[73] Assignee: U.S. Philips Corporation, New York, N.Y.

[21] Appl. No.: 388,386

[22] Filed: Jun. 14, 1982

[30] Foreign Application Priority Data

Jun. 24, 1981 [FR] France ................. 81 12412

[51] Int. Cl.³ .................. H03D 3/18; H03K 9/06
[52] U.S. Cl. .................... 329/107; 329/126; 329/137; 329/145; 375/94; 455/214
[58] Field of Search ............ 329/50, 107, 126, 137, 329/145; 455/214, 337; 375/94

[56] References Cited

U.S. PATENT DOCUMENTS 3,387,220 6/1968 Lender ................. 329/145 X
3,778,727 12/1973 Williams ............... 329/145 X Primary Examiner—Siefgried H. Grimm
Attorney, Agent, or Firm—Thomas A. Briody; William J. Streeter; Edward W. Goodman

[57] ABSTRACT

A digital circuit for demodulating a signal which was modulated in accordance with the relation $$X = A \sin\left(\omega_o t + \int_0^t f(t) \cdot dt + \phi_o\right)$$

wherein $\omega_o$ is the carrier and $f(t)$ the modulating signal. This circuit comprises first of all two distinct paths which are arranged in parallel and are formed by two digital value determining stages (20) and (30), the first stage being intended to determine the values of the function $$M = (1/A)\cos\left(\omega_o t + \int_0^t f(t) \cdot dt + \phi_o\right)$$

which correspond to the values of the input signal of the two paths and the second stage (30) being intended to determine the derivative of the input signal for said same values of the input signal. The circuit also comprises, at the output of these two paths, a multiplying circuit (40) for corresponding signals supplied by the first and second stages (20) and (30), intended to recover a digital signal which is proportional to the instantaneous frequency of the input signal. A clock circuit (50) determines the rate of operation of the first and second stages (20) and (30) and of the multiplying circuit (40).

7 Claims, 1 Drawing Figure

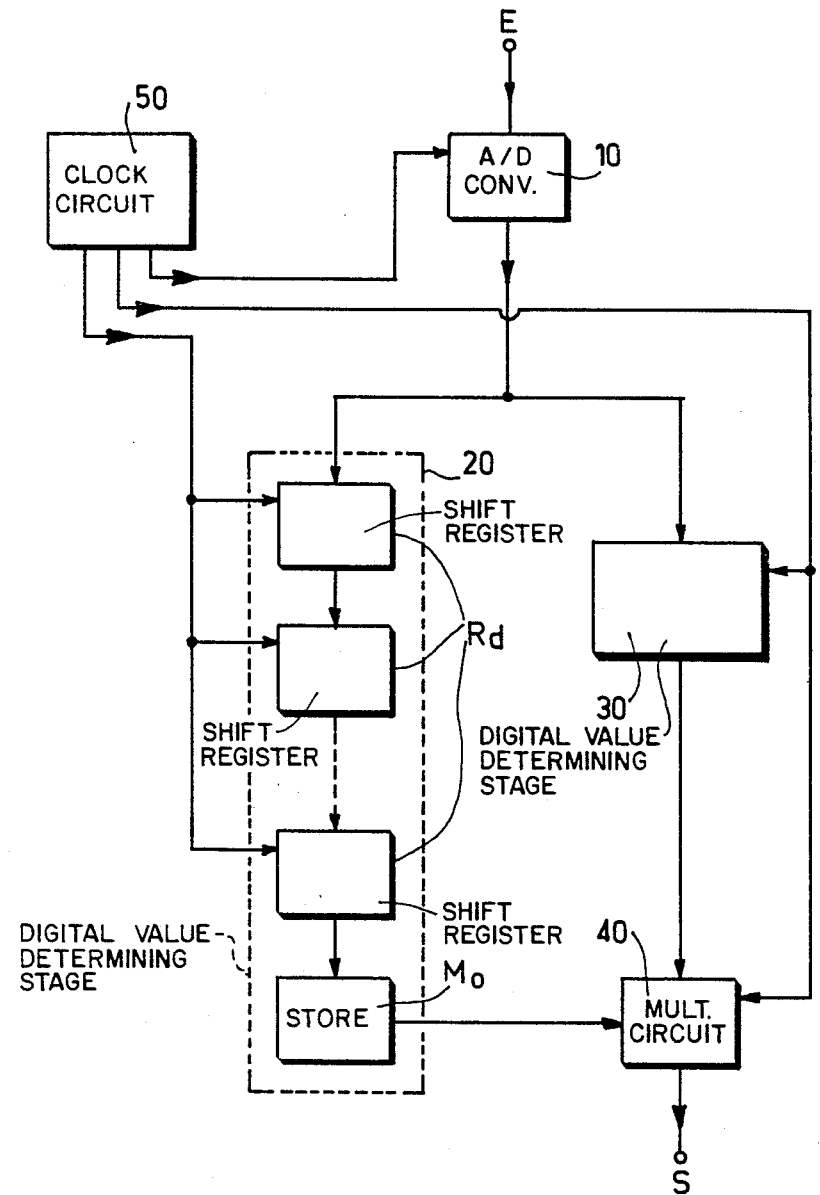

DIGITAL FM DEMODULATOR USING DELAY CIRCUITS

BACKGROUND OF THE INVENTION

The present invention relates to a digital circuit for demodulating a frequency-modulated signal, as well as to the use of such a circuit in a chrominance signal demodulation stage of a television receiver; it should be understood that the invention also relates to all other types of television receivers incorporating such a demodulation stage.

SUMMARY OF THE INVENTION

More specifically, the invention has for its object to provide a circuit comprising original demodulation means operating by recovering a signal which is proportional to the instantaneous frequency of the modulated input signal, on the basis of the derivative of this input signal. To this effect, the invention relates to a digital circuit for demodulating a signal, which signal was modulated in accordance with the relation $$X = A \sin\left(\omega_o t + \int_o^t f(t) \cdot dt + \varphi_o\right)$$

wherein $\omega_o$ is the carrier, $f(t)$ the modulating signal, and $A$ and $\phi_o$ are constants, and then analog-to-digitally converted, characterized in that the digital circuit comprises:

(A) at the input, arranged in parallel with each other, two distinct paths formed by two digital value determining stages, the first stage being intended to determine the values of the function $$M = (1/A)\cos\left(\omega_o t + \int_o^t f(t) \cdot dt + \varphi_o\right)$$

which correspond to the value of the input signal which is common to the two paths and the second stage being intended to determine the derivative of the input signal for said same values of the input signal;

(B) at the output of these two paths a multiplying circuit multiplying corresponding signals supplied by the first and second digital value determining stages, intended to recover a digital signal which is proportional to the instantaneous frequency of the frequency-modulated input signal; and (C) a clock circuit which determines the rate of operation of the first and second digital value determining stages and the multiplying circuit.

The recovery aimed at is thus obtained with the aid of a structure which, in view of the general expression of the derivative of a function and the possibility to isolate in such an expression the expression which gives the instantaneous frequency of the modulated input signal, renders it possible to determine separately, at a predetermined rate which controls the precision of the demodulation, the consecutive instantaneous digital values of the components of this expression of the instantaneous frequency.

DESCRIPTION OF THE DRAWING

Further particulars and advantages of the invention will become apparent in a more detailed manner from the following description which is given by way of non-limitative example with reference to the accompanying drawing, which shows an embodiment of the circuit in accordance with the invention.

DESCRIPTION OF THE PREFERRED EMBODIMENT

In a first embodiment, the embodiment shown in the FIGURE, the circuit in accordance with the invention comprises an analog-to-digital converter 10, which receives the frequency-modulated input signal, and, at the output of said converter 10 and arranged in parallel with each other, two distinct paths formed by two digital value determining stages 20 and 30, a circuit 40 ensuring multiplication of the corresponding signals supplied by these two stages and thus recovering a digital output signal which is proportional to the instantaneous frequency of the frequency-modulated input signal.

Actually, if, $\omega_o$ being the carrier frequency, $f(t)$ the modulation signal, and $A$ and $\phi_o$ constants, the modulated input signal has the form:

$$X = A \sin\left[\omega_o t + \int_o^t f(t) \cdot dt + \varphi_o\right] \quad (1)$$

(or a similar form obtained with a cosine), the derivative of this function is of the form:

$$X' = A \cos\left[\omega_o t + \int_o^t f(t) \cdot dt + \varphi_o\right] \cdot [\omega_o + f(t)] \quad (2)$$

Determining the derivative $X'$ and the function $$M = (1/A) \cos\left[\omega_o t + \int_o^t f(t) \cdot dt + \varphi_o\right]$$

renders it possible to obtain the expression of the modulation signal:

$$f(t) = (X' \cdot M) - \omega_o \quad (3)$$

In the described embodiment, the first stage (20), intended to determine the digital value of the function M, comprises a plurality of shift registers $R_d$, which have for their object to delay the input signal of the stage 20 by a period of time which is specified hereinafter, and a digital store $M_o$ which, for each specific value of the input signal resulting from the sampling action effected by the converter 10, contains a corresponding specific value of the function M (this store $M_o$ thus actually contains a table of the values of M, the addresses of these value being supplied by the sinusoidal input function). The second stage 30, intended to determine the digital value of the derivative of the input signal for these same specific values of the input signal, is a transversal linear filter having N delay circuits, N being even.

In order to ensure synchronization of the corresponding results of the determinations of the function M and of the derivative of the input signal effected by the first and second stages 20 and 30, the overall delay of the signal during its path through the stage 20 must be equal to (N−1)/2 times the delay T of each delay circuit of the transversal filter of stage 30. If, for example, N=6, this delay is equal to 2.5 times the unit delay T of the delay circuits of the transversal filter (which are shift registers). This implies that, if the rate at which the stages 20 and 30 operate is given by the frequency F=1/T, these identical rates must however be shifted through one half-cycle with respect to each other to render it possible to obtain the delay 2.5 T, and consequently that the sampling rate of the converter 10 is given by the frequency 2F which is twice the frequency of the stages 20 and 30.

In a second embodiment, not shown, the number N of the delay circuits of the transversal filter may this time be chosen to be an odd number; the overall delay given to the signal flowing through the first digital value determining stage 20 is then equal, when the same formula as mentioned above is used, to an integral number of times the unit delay T of the delay circuits of the transversal filter (wherein, for example, N=11, five times this unit delay). This implies that this time the rates at which the stages 20 and 30 operate are not only identical but also synchronous and that the rate of operation may be the same for the converter 10 and for the first and second stages 20 and 30. An advantage of this second embodiment is now very obvious: for a same unit delay T the sampling frequency F=1/T determined by the clock circuit 50 is twice as low as in the case of the first embodiment. The second embodiment requires however a number of shift registers which is significantly higher than the number required in the first embodiment, but in contrast therewith this number may be reduced if the delay circuits of the first stage 20 are formed by the first delay circuit of the second stage 30.

The present invention is of course not limited to these embodiments on the basis of which other variations may be proposed without departing from the framework or the scope of the invention. It is in particular possible to use the circuit in accordance with the invention to realize a digital demodulation stage of the (frequency-modulated) chrominance signal of a television receiver; so the invention also relates to any type of television provided with such a demodulation stage. It is however obvious that the invention does not only relate to television but in a very general way relates to all frequency demodulation problems.

In the case of the embodiments described here it is possible to include in the clock circuit 50 an inhibiting circuit intended to enhance the cancellation, at the output of the multiplying circuit 40, of signal values which correspond to the asymptotic values of the function M and which give rise to considerable demodulation faults.

What is claimed is:

1. A digital circuit for demodulating a signal, which signal was modulated in accordance with the relation $$X = A \sin\left( \omega_o t + \int_o^t f(t) \cdot dt + \varphi_o \right)$$

wherein $\omega_o$ is the carrier, f(t) the modulating signal, and A and $\varphi_o$ are constants, and then analogue-to digitally converted, characterized in that said digital circuit comprises:
(A) an input, to which said digitally converted signal is applied, two distinct paths arranged in parallel with each other and coupled to said input, said paths being formed by two digital value determining stages, the first stage determining the values of the function $$M = (1/A)\cos\left( \omega_o t + \int_o^t f(t) \cdot dt + \varphi_o \right)$$

which correspond to the values of the input signal which are common to the two paths, and the second stage determining the derivative of the input signal for said same values of the input signal;
(B) a multiplying circuit coupled to an output of each of said paths for multiplying corresponding signals supplied by the first and second digital value determining stages, said multiplying circuit recovering a digital signal which is proportional to the instantaneous frequency of the frequency-modulated input signal; and
(C) a clock circuit for determining the rates of operation of the first and second digital value determining stages and the multiplying circuit.

2. A circuit as claimed in claim 1, characterized in that the second digital value determining stage is a linear transversal filter having N delay circuits and that the first digital value determining stage comprises delay circuits and a digital memory, these delay circuits producing in the signal flowing through this first stage a delay which is equal to (N−1)/2 times the delay of each delay circuit of the transversal filter and to conveying to the digital memory the address in which there is the value of the function M which corresponds to the value of the derivative present at the output of the transversal filter.

3. A circuit as claimed in claim 1 or 2, characterized in that the control effected by the clock circuit is provided to cancel at the output of the multiplying circuit the signal values which would correspond to the asymptotic values of the function M.

4. A circuit as claimed in claim 2, characterized in that the number N of the delay circuits of the transversal filter is even, and in that the clock circuit imposes on the delay circuits of the first and second digital value determining stages rates of operation which are identical but shifted by one half-cycle with respect to each other.

5. A circuit as claimed in claim 2, characterized in that the number N of the delay circuits of the transversal filter is odd, and in that the clock circuit imposes on the delay circuits of the first and second digital value determining stages rates of operation which are identical and synchronous.

6. A circuit as claimed in claim 3, characterized in that the number N of the delay circuits of the transversal filter is even, and in that the clock circuit imposes on the delay circuits of the first and second digital value determining stages rates of operation which are identical but shifted by one half-cycle with respect to each other.

7. A circuit as claimed in claim 3, characterized in that the number N of the delay circuits of the transversal filter is odd, and in that the clock circuit imposes on the delay circuits of the first and second digital value determining stages rates of operation which are identical and synchronous.

* * * * *